(12) United States Patent
Arnold et al.

(10) Patent No.: US 7,898,275 B1
(45) Date of Patent: Mar. 1, 2011

(54) KNOWN GOOD DIE USING EXISTING PROCESS INFRASTRUCTURE

(75) Inventors: Richard W. Arnold, McKinney, TX (US); Weldon Beardain, Denison, TX (US); Daniel W. Prevedel, Fort Collins, CO (US); Donald E. Riley, Midland, TX (US); Lester L. Wilson, Sherman, TX (US)

(73) Assignee: Texas Instruments Incorporated, Dallas, TX (US)

( * ) Notice: Subject to any disclaimer, the term of this patent is extended or adjusted under 35 U.S.C. 154(b) by 808 days.

(21) Appl. No.: 09/164,580

(22) Filed: Oct. 1, 1998

Related U.S. Application Data

(60) Provisional application No. 60/060,800, filed on Oct. 3, 1997.

(51) Int. Cl.
*G01R 31/00* (2006.01)
*H01L 23/48* (2006.01)

(52) U.S. Cl. .................... 324/756.01; 257/734
(58) Field of Classification Search .............. 257/48; 324/755, 758, 528, 765, 761, 158, 754, 763, 324/500, 76.11; 438/11, 17, 14, 15, 18
See application file for complete search history.

(56) References Cited

U.S. PATENT DOCUMENTS

| | | | | |
|---|---|---|---|---|
| 3,811,186 A | * | 5/1974 | Larnerd et al. | 29/840 |
| 4,716,049 A | * | 12/1987 | Patraw | 427/96 |
| 4,783,719 A | * | 11/1988 | Jamison et al. | 361/751 |
| 5,414,298 A | * | 5/1995 | Grube et al. | 257/690 |
| 5,477,160 A | * | 12/1995 | Love | 324/755 |
| 5,489,854 A | * | 2/1996 | Buck et al. | 324/761 |
| 5,682,064 A | * | 10/1997 | Atkins et al. | 257/701 |
| 5,815,000 A | * | 9/1998 | Farnworth | 324/755 |
| 5,821,624 A | * | 10/1998 | Pasch | 257/776 |
| 5,892,271 A | * | 4/1999 | Takeda et al. | 257/668 |
| 5,929,647 A | * | 7/1999 | Akram et al. | 324/755 |
| 5,931,371 A | * | 8/1999 | Pao et al. | 228/180.22 |
| 5,977,783 A | * | 11/1999 | Takayama et al. | 324/754 |
| 5,985,682 A | * | 11/1999 | Higgins, III | 438/10 |
| 6,025,732 A | * | 2/2000 | Foo et al. | 324/760 |
| 6,028,437 A | * | 2/2000 | Potter | 324/757 |
| 6,229,319 B1 | * | 5/2001 | Johnson | 324/751 |
| 6,369,595 B1 | * | 4/2002 | Farnworth et al. | 324/755 |
| 6,728,113 B1 | * | 4/2004 | Knight et al. | 361/760 |

* cited by examiner

*Primary Examiner* — Scott B Geyer
(74) *Attorney, Agent, or Firm* — Wade J. Brady III; Frederick J. Telecky, Jr.

(57) ABSTRACT

An apparatus for testing a semiconductor die and the method wherein there is provided a package having a cavity therein with a plurality of terminals in the package disposed at the periphery of the cavity. A semiconductor die to be tested and having a plurality of bond pads thereon is disposed in the cavity and an interconnecting layer having electrically conductive paths thereon is also disposed in the cavity, each of the paths having first and second spaced apart regions thereon, the first region of each path being aligned with and contacting a bond pad. An interconnection is provided between the second spaced apart region of each of the paths and one of the plurality of terminals. The second spaced apart region of each of the paths is preferably a bump aligned with and contacting one of the plurality of terminals. A compliant layer is preferably disposed over the interconnecting layer and provides a force causing engagement of at least the first spaced apart regions and the bond pads. The first region is preferably a compliant bump probe tip having a first predetermined height above the layer and includes a standoff on the layer having a second predetermined height above the layer less than the first height.

17 Claims, 3 Drawing Sheets

KNOWN GOOD DIE USING EXISTING PROCESS INFRASTRUCTURE

CROSS REFERENCE TO RELATED APPLICATIONS

This application claims priority under 35 USC §119 (e) (1) of provisional application No. 60/060,800, filed Oct. 3, 1997, the contents of which are incorporated herein by reference.

BACKGROUND OF THE INVENTION

1. Field of the Invention

The present invention relates in general to the testing of semiconductor devices and, in particular, to the use of existing test and burn-in infrastructure for the testing of a known good die (KGD) which is a bare, unpackaged die that has been tested to the equivalent of a packaged and fully tested semiconductor device.

2. Brief Description of the Prior Art

At present, there is no good low cost and low volume approach to production of KGD that uses the existing test and burn-in infrastructure. If the semiconductor die requires burn-in to insure the reliability of the device, expensive die test carriers and special test and burn-in tooling are required for the production of KGD.

Currently, the state of the art for testing KGD devices requires that the die be temporarily held in a test jig of some form in order to establish electrical contact between the input and output (input/output) pads on the device under test (DUT) and the test instrumentation. At this level, this has previously been accomplished in the art by one of two procedures. One technique, "soft" tape automatic bonding (TAB), requires making a temporary bond to the DUT input/output pads. This can give rise to considerable damage to the pads after removal. The second method for holding the DUT in a test assembly is to use a carrier in the form of an MCM with probe tips formed from hard metal bumps. The probe tips on the modules are arranged in a pattern to exactly match the positions of the input/output pads on the DUT. The DUT is aligned with the probe tips by means of either a mechanical "alignment fence" or an optical technique. Because the probe tips are not sufficiently planarizing over the surface of the die, large forces are required in order to insure good electrical contact with every input/output pad on the die. The hard metal probe tips may damage the pads. Because of the cost associated with KGD testing and quality problems posed by the "soft TAB" and MCM methods, there is a need in the art for an improved test assembly for the testing of KGD.

SUMMARY OF THE INVENTION

In accordance with the present invention, the above described problems of the prior art are minimized.

It is apparent that an approach is desirable which can reuse the existing semiconductor package, thereby making a separate production line for the testing and burn-in of the KGD unnecessary. It would be desirable if the KGD supplied could use this approach along with the relatively small purchase of some tooling that would go into the existing package along with the dies and then manufacture of the KGD. The cost of tooling is much less than purchase of separate carriers for test and burn-in. By using the existing package and test and burn-in infrastructure, this approach would open up the low volume and low cost production of KGD for the producers of KGD. Most multichip module (MCM) programs that consume KGD operate in the small to medium volume market for KGD. These purchasers would then also have an economical source of KGD.]

Briefly, a reusable package having leads thereon is provided and a silicon membrane is utilized to route the signals from the pads on the semiconductor die under test to the existing package leads. The silicon membrane interfaces with the semiconductor die through compliant bumps. The compliant bumps insure that the die always has contact to the package leads. Also, standoffs are located upon the silicon membrane polymer that insure that the compliant bumps are not over-compressed and that the aluminum bond pads upon the die are not damaged through the compression of the bump thereagainst. The compliant bump also insures that any lack of coplanarity between the die and the silicon membrane is not sufficiently significant such that the die loses contact during test and burn-in. The preferred package is assembled with the silicon membrane located in the base of the ceramic package. The height of the membrane along with the thickness of the elastomer material upon the top of the die determines the force of contact between the compliant bump and the die. The optimal force exerted by the compliant bump on the die is, for example, about 8 grams of force. The silicon membrane is accurately placed into a cavity in the package by optical alignment which is well known and the die is placed over the silicon membrane, also with optical alignment so that pads on the die contact predetermined conductive paths on the silicon membrane. Then an elastomeric spring of a predetermined thickness to provide the desired force is placed over the die. Once the elements are finally assembled, a temporary lid that matches the identical package profile is placed upon the assembly. The lid is attached with a temporary adhesive such as, for example, one that cures at 150° C. Before the package and lid are cured, the assembly stage has a built-in continuity tester that checks to make sure that the die and membrane are making contact. After the continuity check, the package is ready for cure and then transportation to the existing test and burn-in line.

The present invention utilizes the existing package for KGD production. The membranes are built up specific to the particular package and particular die revision that is currently being processed by the semiconductor supplier. The KGD uses compliant bumping technology for interconnection to the semiconductor die of, for example, the type set forth in U.S. Pat. No. 5,508,228, the contents of which are incorporated herein by reference. Standoffs are used to insure that the die bond pads are not damaged by compression and that the coplanarity between the die and silicon test membrane is maintained. The standoffs are made of polymers to insure that the die surface is not damaged. The die is placed in the package with a visual alignment tool. The tooling set, where the die is place into the existing package, includes an electrical continuity checker to insure that the die is located properly in the test carrier. The height of the silicon membrane relative to the ceramic package determines the force of the compliant bump on the semiconductor die. A lid that matches the existing package profile is attached with temporary adhesive. The lid is cured on the package and can be removed later with a knife blade action below the adhesive. The existing test handling equipment can be used for which the device under test has already been characterized. The existing burn-in tooling that the device presently uses can be used. The approach is a set up for the low volume and low cost market niche such as, for example, military products for low volume lad multichip module producers.

KGD using existing process infrastructure in accordance with the present invention is much more economical than using a test carrier based technology of the prior art. The user does not require set up of a special test and burn-in line to manufacture KGD and is not required to maintain separate programs for the two different lines. The only components for set up are design of the silicon membrane using existing packages and temporary lids.

BRIEF DESCRIPTION OF THE DRAWINGS

FIG. 1b is an inverted view of the interconnecting medium 140 of FIG. 1a;

FIG. 2 is an assembled cross sectional view of the assembly of FIG. 1a;

DESCRIPTION OF THE PREFERRED EMBODIMENT

Figure 1A:
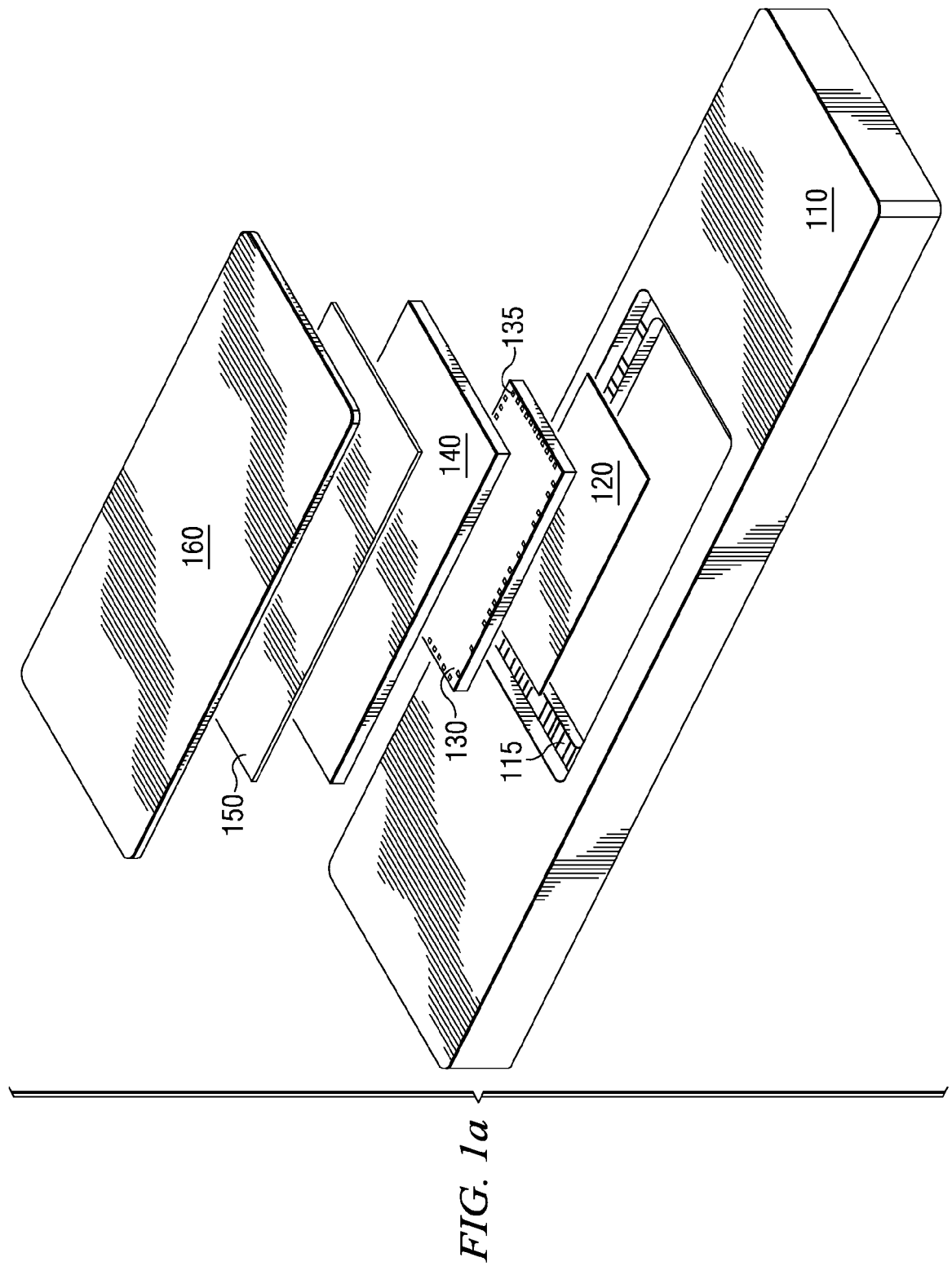
FIG. 1a is an exploded view of a standard integrated circuit package for a specific device modified in accordance with the present invention to hold the integrated circuit and KGD membrane.

Referring first to FIG. 1a, there is shown an exploded view of a standard integrated circuit (IC) package for testing many copies of a specific identical semiconductor device, the package being modified in accordance with the present invention to hold the integrated circuit and KGD interconnecting medium for that circuit. There is shown a standard IC package 110 having a cavity therein 112 and having standard package terminals 115 at the bottom of the cavity, these terminals being shown at two adjacent bottom ends of the cavity, however it should be understood that these terminals can be located anywhere along the ends of the cavity and are designed to be contacted by bumps at the edges of the interconnecting medium 140 as will be explained hereinbelow. A lower layer of compliant material 120, such as, is disposed over the base of the cavity 112 but does not cover the terminals 115 which are still exposed and the semiconductor die 130 with bond pads 135 thereon is disposed over the compliant material and accurately positioned by a well known visual alignment tool. The interconnecting medium 140, which is also shown inverted and enlarged in FIG. 1b, includes electrically conductive paths or traces 173 on its underside for connection to the bond pads 135 via inner connections 171 and with the terminals 115 via outer connections 172. Bumps are provided at the outer connections to insure contact with the terminals 115. Accurate alignment of the bond pads 135 with the inner connections 171 and the terminals 115 with the outer connections 172 is also provided by a well known visual alignment tool. An upper layer of compliant material 150, generally of the same material as the lower compliant material 120, is disposed over the die 130 with a package lid 160 disposed over the upper layer of compliant material. The exploded view of the package of FIG. 1a is shown in assembled state in FIG. 2 and a connection between a bond pad 135 and a package terminal 115 is shown by a bond wire 131. [correct FIG. 2 to mimic FIG. 1].

Figure 1B:
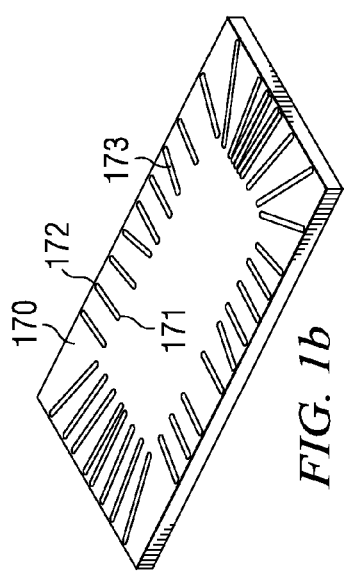
Figure 2:
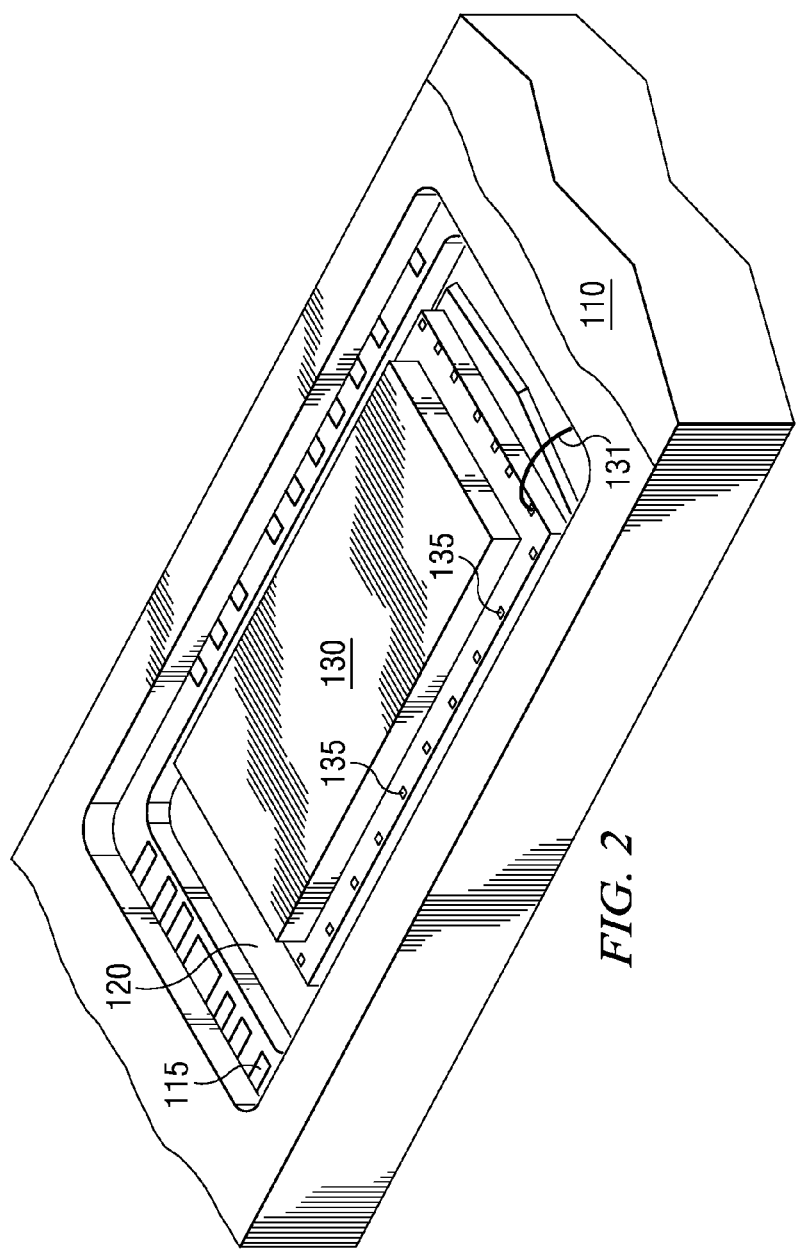
Figure 3:
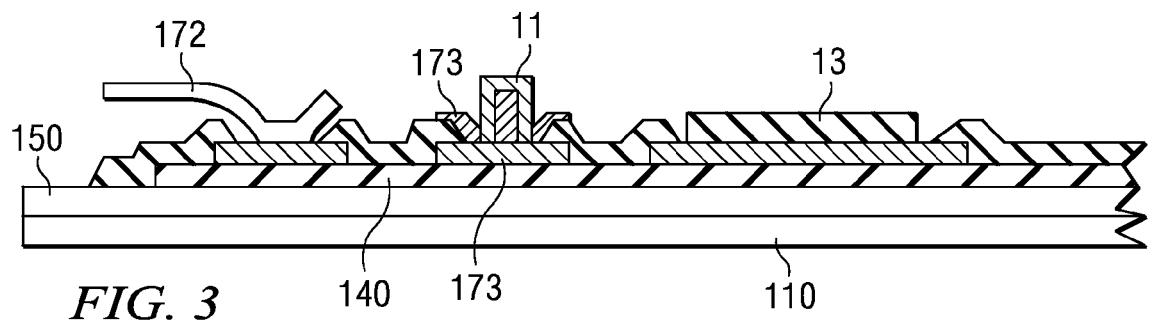
FIG. 3 is a cross sectional view of a further embodiment of the interconnecting medium 140 in accordance with the present invention.

Referring to FIG. 3, there is shown an arrangement of the interconnecting medium 140 of FIGS. 1a and 1b wherein the inner connections 171 are provided by compliant bump probe tips 11. The compliant bump probe tips 11 permit a pressing force to be performed with little or no stressing of the DUT, since the compliant bump probe tips already in contact with bond pads 135 may be compressed slightly, so that the other compliant bump probe tips are able to eventually make contact with bond pads. Thus, the bumps 11 are compressed within the elastic limit of the material.

Also, fabricated on the interconnecting medium 140 as shown in FIG. 3 are standoffs 13 which serve to act as controlled collapse stops when the head assembly is in operation. These standoffs 13 insure that, in operation, the compliant bump probe tips are not driven beyond their elastic limit. The standoffs may be fabricated from metal or of a polymer material, the same polymer material from which the compliant bump probe tips are formed being suitable. If the same polymer material is used, the standoffs should each be larger in area than the compliant bump probe tips so as to have limited compressibility compared to the compliant bump probe tips. Forming the standoffs from the same polymer material as the compliant bump probe tips has the advantage of membrane fabrication simplicity.

More specifically, in FIG. 3, there is provided an embodiment using compliant bump probe tips 11, the thin metal shell on the compliant bump of the compliant bump probe establishing the electrical connection between the compliant bump probe tip and the electrically conducting traces 173. Also, the structure of the compliant bump probe tips 11 may be shaped to effect a "scrubbing" action as pressure is applied to make contact between the membrane and the DUT 130. This can effect an improved electrical contact between the DUT and membrane by "scrubbing" through the oxide coat that usually forms on the bond pads 135 of the DUT. An optional layer of probe material performs the scrubbing action. In a second embodiment, abrasive particles may be embedded in the surface of the compliant bump probe tips in order to effect better penetration of the oxide coat that typically forms on the DUT bond pads pads.

The membrane as shown in FIG. 3 is mounted in a recessed portion of the package base and affixed to the recessed portion by a bonding material. The height of the membrane in the package is controlled by the thickness of the bonding material. The bonding material may be an elastomeric material. This also serves to effect some global planarization of the DUT when the probe head assembly is in operation.

In operation, the package lid 160 (FIG. 1a) with the DUT 130 thereunder is brought into contact with the interconnecting medium 140. Alignment of the DUT 130 with the membrane is accomplished using either optical alignment or mechanical alignment fence techniques, such techniques being well known to those skilled in the art. In an embodiment using compliant bump probe tips 11, the DUT 130 is brought into contact with the membrane or interconnecting medium 140 with sufficient pressure to compress the compliant bump probe tips, and/or the elastomeric bonding materials, but not so much pressure as to compress the standoffs. The package lid 160 is then held in place against the package base 110 by solder, mechanical clamp or similar means (not shown), all of which are well understood by one of ordinary skill in the art. Test and burn-in is then performed, followed by removal of the package lid, and removal of the DUT from the bonding layer. The probe head assembly is then ready for another test cycle.

Figure 4:
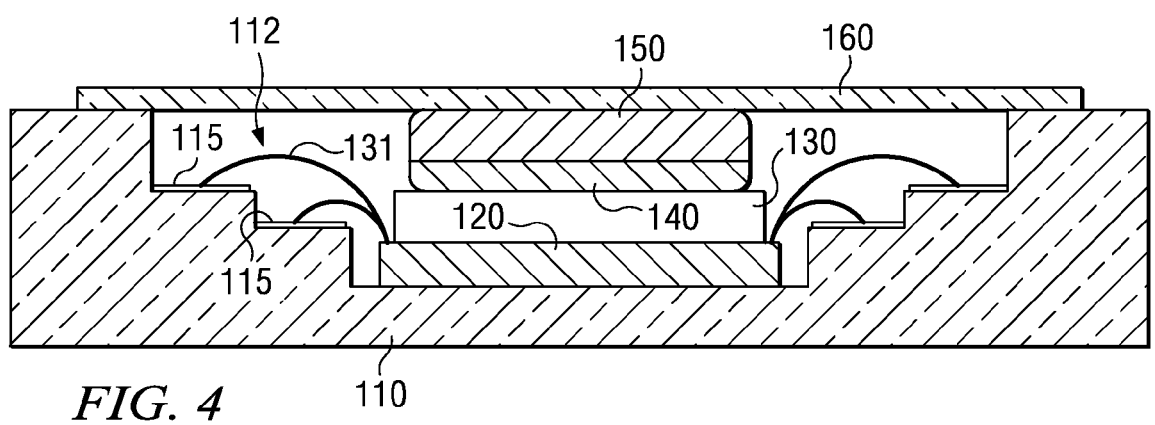
FIG. 4 is a cross sectional view of an alternative embodiment in accordance with the present invention.

In an alternative embodiment, the interconnecting medium outer connection 172 can be eliminated with connection between the conductive paths 173 and the package terminals 115 being made by standard wire bonding techniques with wires 131 as shown in FIG. 4.

Referring to the embodiments of FIGS. 1 to 4, the package has a lower compliant material 120 placed in the bottom or base of the cavity 112. This material provides compliancy to the device to be tested. The die 130 is placed in the package over the compliant material 120 face or bond pads facing up and 4 to 5 mils above the package terminals 115 being connected to the package leads. The KGD membrane 140 is placed over the device to be tested 130. The bond pad on the die is connected to the appropriate compliant bump 11 on the membrane 140. The compliant bump 11 on the membrane 140 is routed out, in another embodiment (not shown) to another compliant bump which is, in turn, located over the appropriate package terminal 115. On top of the membrane 140 is located an upper compliant material 150 that ensures coplanarity between the lid and membrane 140, not the device under test. The package lid 160 is located over the upper compliant material and is attached temporarily to the package with an adhesive material or by some other means.

The flip configuration of the KGD package uses the same existing package with which the device under test would normally be processed. The membrane 140 is attached permanently in the base of the package by means of some adhesive material. The membrane 140 mirrors the device under test 130. The membrane 140 is built so that the appropriate compliant bump interconnects with the appropriate signal and in the device under test. To ensure that the proper signal is routed to the proper package lead, the signal lines are rerouted on the membrane 140. In this manner, the same standard IC package 110 can be used for different types of chips 130 with the only change generally required being in the routing of the conductive paths 173 on the membrane 140. The conductive paths 173 cross the surface of the membrane 140 to a bonding pad where interconnection to the proper package part is possible. A wire lead is made from the KGD bond pad 135 to the appropriate package part and then the signal line emulates that of the existing package. The device to be tested is visually placed on the membrane so that the appropriate bond pads are connected to the appropriate compliant bumps. A compliant material is placed on top of the device to be tested which ensures that the device will remain affixed to the top of the membrane during the testing and burn-in cycles. The lid is placed on top of the compliant material and is temporarily attached to the package with an adhesive material. The lid can easily be removed after the testing cycle.

The compliant bump technology is discussed in U.S. Pat. No. 5,508,228, the contents of which are incorporated herein by reference.

The DUT can be mounted on the package lid by a layer of bonding material which may be an elastomeric material. In one embodiment, the elastomeric material offers some additional global planarization properties due to compressibility properties.

The membrane 140 is preferably larger than the DUT and is an electrically insulating layer. In one embodiment, the membrane head is fabricated of silicon in order to achieve an adequate thermal coefficient of expansion match between the DUT and the membrane over the range of operating temperatures of the invention. In one embodiment, compliant bumps include a refractory thin metal shell covering a polymer bump which has compliant properties that will allow multiple compressive cycles with the elastic limit of the material.

In another embodiment, the package may have a hinged lid that automatically aligns the DUT to the membrane.

Although the present invention has been described with reference to specific preferred embodiments thereof, many variations and modification will immediately become apparent to those skilled in the art. It is therefore the intention that the appended claims be interpreted as broadly as possible in view of the prior art to include all such variations and modification.

The invention claimed is:

1. An apparatus for testing a semiconductor die which comprises:
   (a) a package having a cavity therein;
   (b) a plurality of terminals in said package disposed at the periphery of said cavity;
   (c) a semiconductor die to be tested having a plurality of bond pads thereon, said die disposed in said cavity;
   (d) an interconnecting layer having electrically conductive paths thereon disposed in said cavity, each of said paths having first and second spaced apart regions thereon, said first region of each path being aligned with and contacting a said bond pad, said first region including a compliant bump probe tip having a first predetermined height above said layer and further including a standoff on said layer having a second predetermined height above said layer less than said first height; and
   (e) an interconnection between said second spaced apart region of each of said paths and one of said plurality of terminals.

2. The apparatus of claim 1 wherein said second spaced apart region of each of said paths is a bump aligned with and contacting one of said plurality of terminals.

3. The apparatus of claim 1 further including a compliant layer disposed over said interconnecting layer and providing a force causing engagement of at least said first spaced apart regions and said bond pads.

4. The apparatus of claim 2 further including a compliant layer disposed over said interconnecting layer and providing a force causing engagement of at least said first spaced apart regions and said bond pads.

5. An interconnecting layer for use in a semiconductor package which comprises;
   (a) an electrically insulating layer;
   (b) electrically conductive paths on said layer, each of said paths having first and second spaced apart regions thereon, said second spaced apart region of each of said paths having a compliant bump having a height greater than all other structures on said layer; and
   (c) a standoff disposed on said layer and having a height above said layer and less than said bump.

6. The layer of claim 5 wherein said second region is a bump extending above the level of said electrically conductive path.

7. The layer of claim 6 wherein said layer is flexible.

8. The layer of claim 5 wherein said layer is flexible.

9. An apparatus adaptable for the testing of semiconductor devices comprising:
   a package; and
   an interconnecting medium contained within said package having electrical paths adaptable for coupling to test circuitry, wherein said interconnecting medium includes a medium surface, a plurality of standoffs affixed to said medium surface, and a plurality of probe tips affixed to said medium surface, said probe tips adaptable for making electrical contact with pads on said semiconductor device, wherein said probe tips are compliant bump probe tips.

10. The apparatus of claim 9, said package further comprising:
   a package base having an upper surface adapted to receive said interconnecting medium, said medium having a medium lower surface;

a bonding layer interposed between said medium lower surface and said package base upper surface; and a package lid having a lower surface adapted to receive said semiconductor device, wherein said package lid is positioned above said package base.

11. The apparatus of claim 10, wherein said bonding layer is comprised of an elastomeric material.

12. The apparatus of claim 10, wherein said semiconductor device is a die having an upper surface, said upper surface fixed to said package lid lower surface by a bonding layer interposed therebetween.

13. The apparatus of claim 10, wherein said semiconductor device is a wafer having an upper surface, said upper surface fixed to said package lid lower surface by a bonding layer interposed therebetween.

14. The apparatus of claim 13, wherein said bonding layer interposed between said die and said package lid lower surface is comprised of an elastomeric material.

15. The apparatus of claim 9, wherein the compliant bump probe tips are comprised of a solid material.

16. An apparatus adaptable for the testing of semiconductor devices comprising:

a package, wherein said package has a package lid having a lower surface adapted for receiving said semiconductor device, said semiconductor device having an upper surface, and a package base having an upper surface;

an interconnecting medium contained within said package, wherein said interconnecting medium has electrical paths adaptable for coupling to test circuitry, said medium including a medium surface, said medium surface having a plurality of probe tips affixed thereto, a plurality of standoffs affixed thereto, and a lower surface, wherein said probe tips are adaptable for making electrical contact with pads on said semiconductor device and are compliant bump probe tips;

a bonding layer comprising an elastomeric material interposed between said package lid lower surface and said semiconductor device upper surface; and a bond layer comprising an elastomeric material interposed between said interconnecting medium lower surface and said package base upper surface, said package base being adapted for receiving said interconnecting medium.

17. The apparatus of claim 16, wherein the compliant bump probe tips are comprised of a solid material.

* * * * *